(12) United States Patent
Ramanan et al.

(10) Patent No.: US 7,644,871 B2
(45) Date of Patent: Jan. 12, 2010

(54) FLUX SPRAY ATOMIZATION AND SPLASH CONTROL

(75) Inventors: Harikrishnan Ramanan, Chandler, AZ (US); Sabina Houle, Phoenix, AZ (US); Nitin Deshpande, Chandler, AZ (US); Michael Colella, Chandler, AZ (US); Nagaratnam Murugaiah, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/648,119

(22) Filed: Dec. 29, 2006

(65) Prior Publication Data

US 2008/0156851 A1  Jul. 3, 2008

(51) Int. Cl.
*A62C 5/02* (2006.01)
(52) U.S. Cl. .................. 239/8; 239/288; 239/288.5; 239/290; 239/296; 239/403; 239/405; 239/424; 239/425; 239/433; 239/556; 228/33; 228/41
(58) Field of Classification Search ............ 239/8, 239/288.3, 288, 290, 291, 296, 300, 403, 239/405, 406, 418, 423, 424, 433, 548, 552, 239/556, 288.5, 416, 425; 228/33, 223, 41, 228/42
See application file for complete search history.

(56) References Cited

U.S. PATENT DOCUMENTS

| | | | | |
|---|---|---|---|---|
| 3,554,521 A | * | 1/1971 | Rhydderch | 239/291 |
| 3,916,042 A | * | 10/1975 | Grietens | 228/124.1 |
| 4,152,108 A | * | 5/1979 | Reed et al. | 239/425 |
| 5,145,531 A | * | 9/1992 | Turner et al. | 228/41 |
| 5,219,120 A | * | 6/1993 | Ehrenberg et al. | 239/296 |
| 5,615,831 A | * | 4/1997 | Molezzi et al. | 239/8 |
| 6,164,516 A | * | 12/2000 | Watanabe et al. | 228/41 |
| 6,270,019 B1 | * | 8/2001 | Reighard | 239/423 |
| 6,311,899 B1 | * | 11/2001 | Hidaka et al. | 239/290 |
| 6,328,226 B1 | * | 12/2001 | Goenka et al. | 239/424 |
| 6,736,960 B1 | * | 5/2004 | Chen et al. | 239/424 |
| 6,913,182 B2 | * | 7/2005 | Stoops | 228/33 |
| 2008/0237364 A1 | | 10/2008 | Deshpande et al. | |
| 2008/0238589 A1 | | 10/2008 | Quan et al. | |

OTHER PUBLICATIONS

Lasheras et al., "Liquid Jet Instability and Atomization in a Coaxial Gas Stream", 2000, 35 pages.
Hsiang et al., "Near-Limit Drop Deformation and Secondary Breakup", 1992, pp. 635-652.
Nordson, "Airless Nozzle Catalog", Dec. 2003, 202 pages.
Krzeczkowski, "Measurement of Liquid Droplet Disintegration Mechanisms", 1980, pp. 227-239.
Hinze, "Fundamentals of the Hydrodynamic Mechanism of Splitting in Dispersion Processes", 1955, pp. 289-295.
Fraser, "The Atomization of a Liquid Sheet by an Impinging Air Stream", 1962, pp. 339-353.

* cited by examiner

*Primary Examiner*—Steven J Ganey
(74) *Attorney, Agent, or Firm*—Caven & Aghevli LLC

(57) ABSTRACT

Methods and apparatus to improve flux spray atomization and/or splash control are described. In one embodiment, a flux nozzle includes a plurality of injection holes to deposit flux fluid through an exit hole of an air cap onto a substrate (such as a printed circuit board). The flux fluid may atomize prior to deposition onto the substrate as relatively smaller broken down flux droplets that may aid reduced spray splash. Other embodiments are also described.

16 Claims, 4 Drawing Sheets

FLUX SPRAY ATOMIZATION AND SPLASH CONTROL

BACKGROUND

The present disclosure generally relates to the field of electronics. More particularly, an embodiment of the invention generally relates to improving flux spray atomization and/or splash control.

Flux may be utilized during the manufacturing process of electronic devices to assist in soldering processes in integrated circuit technology. In some implementations, flux may be sprayed over a substrate. However, flux overspray and/or spray splash may result in critical issues such as die misalignment, die float, spray paste related rework or touch-up. Addressing these issues may be time consuming and may further add to the costs associated with manufacturing an electronic device.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Figure 1A:
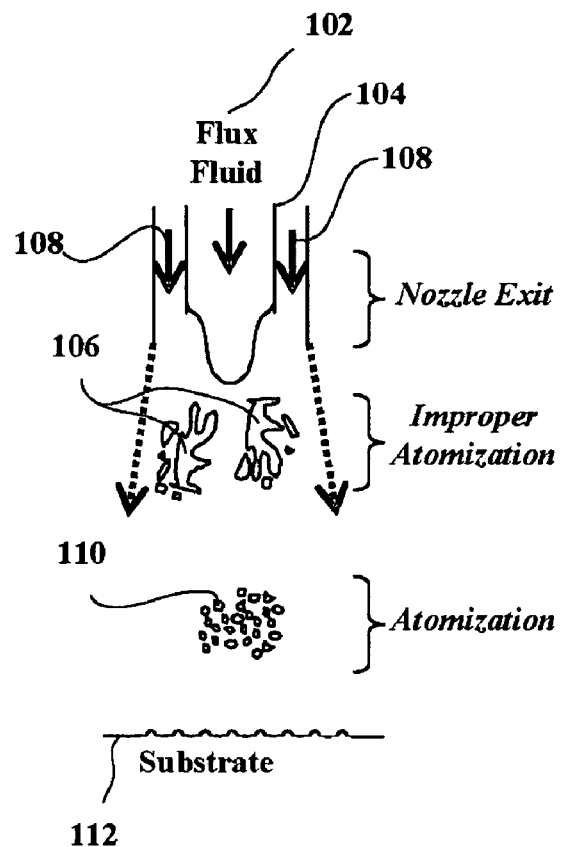
FIGS. 1A-1C illustrate views of flux spray flow in accordance with some embodiments of the invention.

Some of the embodiments discussed herein (such as the embodiments discussed with reference to FIGS. 1-4) may utilize techniques to improve flux spray atomization and/or splash control. More particularly, FIG. 1A illustrates a side view of a flux spray flow pattern development configuration, in accordance with an embodiment of the invention. As shown in FIG. 1A, as flux fluid 102 is dispensed from a flux tube 104, e.g., with assistance from a coaxial assist fluid 108 through a sequential atomization process—from single large droplet to improperly atomized droplets 106 that may further be broken into smaller atomized droplets 110 which subsequently are deposited on a substrate 112. In an embodiment, the coaxial assist fluid 108 may be dispensed around the circumference of the flux tube 104, e.g., as will be discussed with reference to FIG. 2. In one embodiment the size of the atomized droplets 110 may be about 50 µm in diameter. The flux fluid 102 may include various materials that would be classified as soldering fluxes in semiconductor packaging technology. The flux tube 104 may be constructed with various types of material capable of transporting the flux fluid 102 such as metal or metal alloy, plastic or polymer, ceramic, etc. Moreover, the substrate 112 may be any type of a substrate such as a printed circuit board (PCB), organic or ceramic packages, and may include solder bumps to allow for connection of dies to the substrate 112.

Figure 1B:
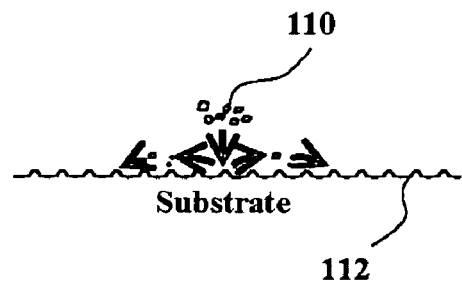
Figure 1C:
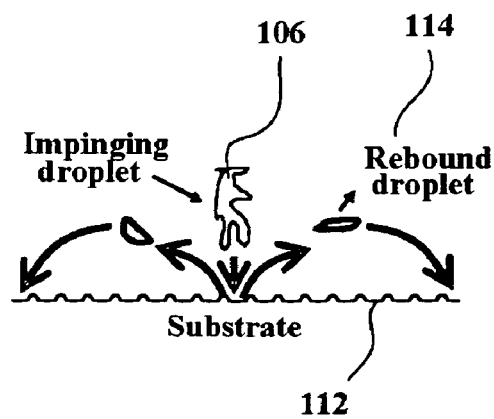

FIG. 1B illustrates results of deposition of droplets 110 on the substrate 112, in accordance with an embodiment. For example, FIG. 1B illustrates how proper atomization may result in a relatively more uniform and/or splash-free deposition of the atomized droplets 110 over the substrate while FIG. 1C shows how improper atomization as in 106 may result in subsequent rebound 114 of the droplets and hence cause undesired spray splash in the process.

Figure 2:
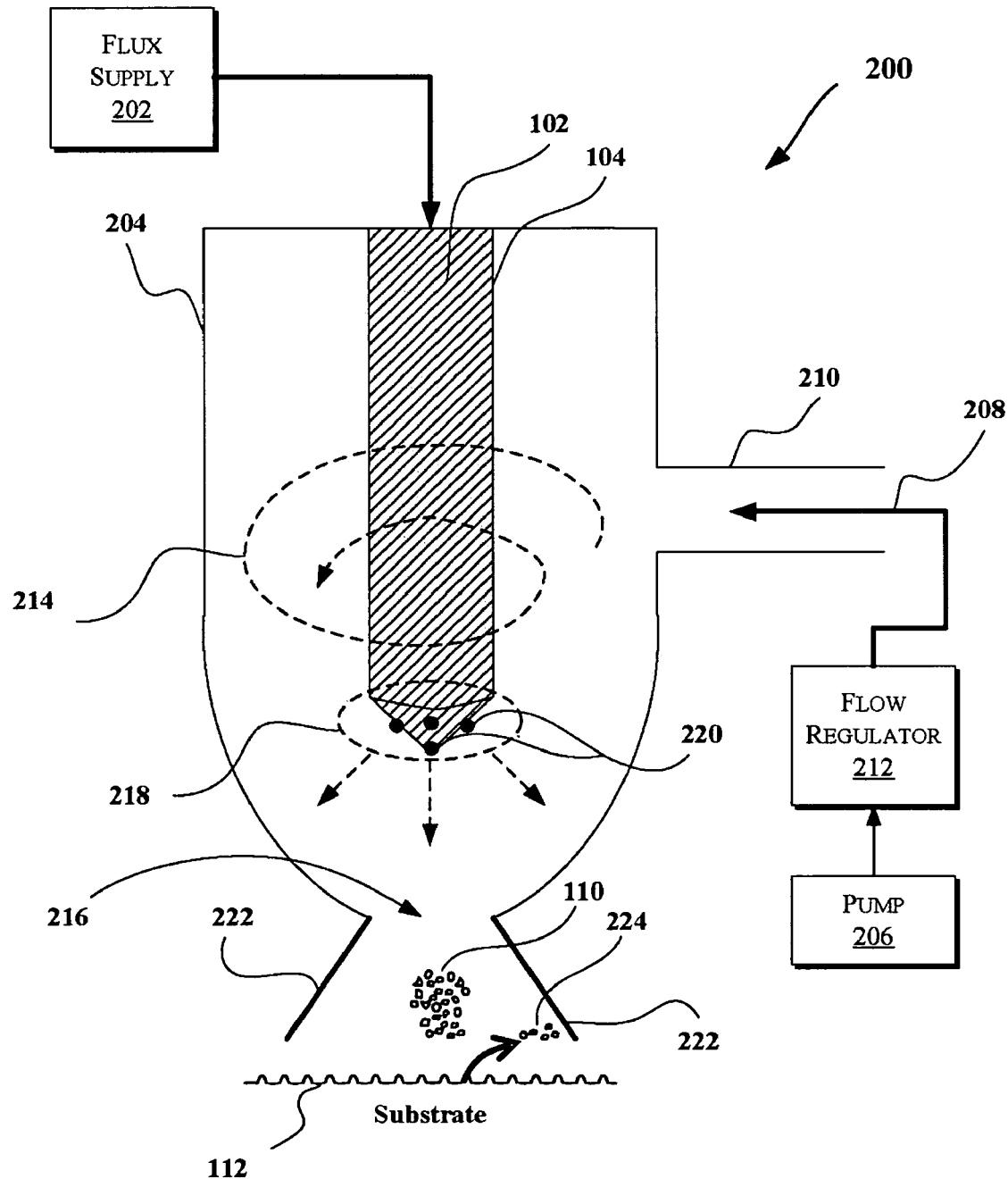
FIG. 2 illustrates a block diagram of a flux spray system, according to an embodiment.

FIG. 2 illustrates a block diagram of a flux spray system 200, according to an embodiment. The system 200 may deliver the flux fluid 102 through the flux tube 104 as the atomized droplets 110 that are deposited on the substrate 112, such as discussed with reference to FIGS. 1A-1C. As shown in FIG. 2, the system 200 may include a flux supply 202 to supply the flux fluid 102. The flux tube 104 may be provided inside an air cap 204. The air cap 204 may be coupled to an air pump 206 to receive a flow of an inert gas 208 (such as air, nitrogen, mixtures thereof, etc.) through an inlet 210. In an embodiment, a flow regulator 212 (such as an inline flow regulator) may be coupled between the pump 206 and the inlet 210 to regulate the flow of gases into the air cap 204. As shown in FIG. 2, after entry into the air cap 204, the gas flow 208 may assume a swirling flow 214 configuration which is subsequently exhausted through an exit hole 216 at the bottom of the air cap 204 in FIG. 2. In an embodiment, the air cap 204 may have a select shape (such as a substantially cylindrical shape) at least in portions that are in proximity to the flux tube 104, e.g., to cause the swirling flow 214.

Figure 3A:
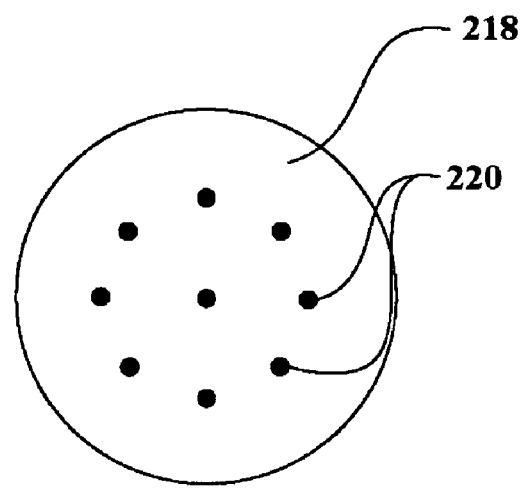
FIGS. 3A and 3B illustrate views of a flux nozzle in accordance with some embodiments of the invention
Figure 3B:
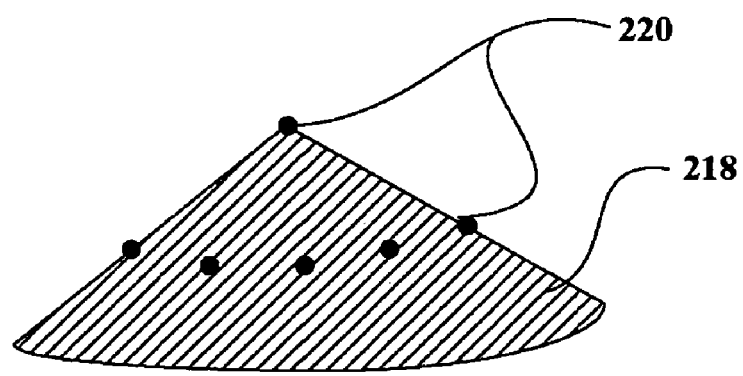
Figure 4:
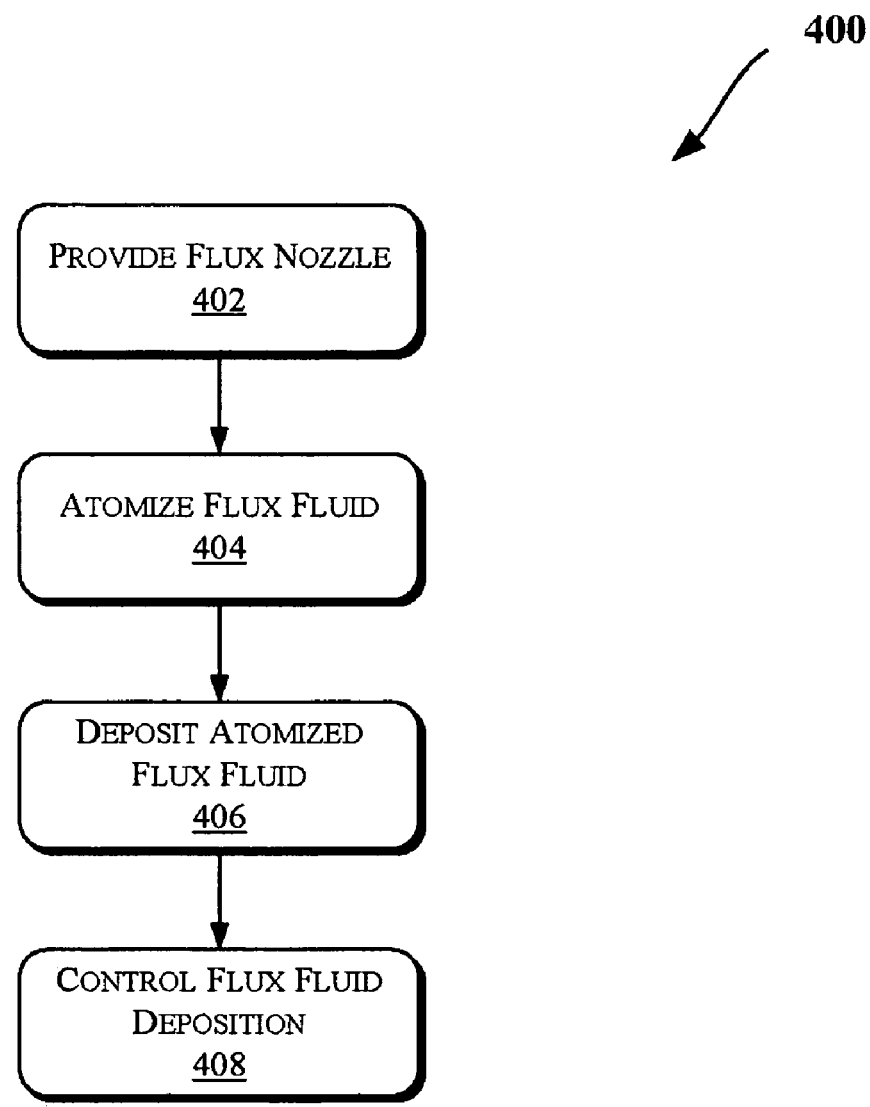
FIG. 4 illustrates a block diagram of a method according to an embodiment.

In an embodiment, the flux tube 104 may include a flux nozzle 218 with one or more injection holes 220 to inject droplets (e.g., atomized droplets 110) towards the exit hole 216 for deposition onto the substrate 112. In one embodiment, the hole(s) 220 may reduce the mean or average particle size in flux spray provided through the air cap exit hole 216. Moreover, the nozzle 218 may have a conical shape in an embodiment. FIG. 3A illustrates a top view of the nozzle 218, according to an embodiment. FIG. 3B illustrates a perspective view of the nozzle 218, according to an embodiment. As shown in FIGS. 3A and 3B, the holes 220 may be provided along a circumference of the nozzle 218 so as to enable flux droplet break-up at the nozzle tip prior to contact with air.

Referring back to FIG. 2, the system 200 may optionally include a shroud 222 to at least partially surround the exit hole 216 on the substrate 112 side. Alternatively, the shroud 222 may completely surround the exit hold 216. In an embodiment, the shroud 222 may be provided in the system 200 to control, reduce, and/or eliminate droplet rebound (224). The shroud 222 may be constructed of any type of material such as metal or metal alloy, plastic or polymer, etc. In one embodiment, the diameter of holes 220 may be in range of 0.5 to 1.5 mm. Furthermore, a prolonged contact of drops with the swirling coaxial air (214) may reduce or eliminate the mean or average size of droplets 110. Additionally, the shroud 222 may have a conical shape with a height of about 5 mm. In some embodiments, the distance between the tip of the shroud facing the substrate 112 and the substrate may be about 500-1000 µm.

In some embodiments, the size of the holes 220 may be selected such that the droplets exiting the nozzle 218 are converted into atomized droplets (110) as early as exiting the nozzle 218 or at least prior to being deposited onto the substrate 112. In an embodiment, the size of the holes 220 may be selected in accordance with the flow pressure of the flux fluid 104 and/or the gas flow 208. Moreover, the interaction between fundamental fluid material properties such as density (ρ), viscosity (μ), surface tension (σ) and contact angle with substrate; equipment design parameters—namely the flow path from the respective fluid reservoirs (e.g., from the flux supply 202) through the mixing zone (e.g., the zone within the air cap 204 between the nozzle 218 and the exit hole 216) to the nozzle holes 220, dispense height, air cap, nozzle diameter and mixing length; and process considerations such as fluid dynamics and mixing characteristics of the two-phase spray (mixture of liquid flux and the atomizing fluid air)—may cause changes to the efficiency of the spray flux atomization process and the conformity of atomized spray dispense to the die-bump area of the substrate.

FIG. 4 illustrates a block diagram of an embodiment of a method 400 to improve flux spray atomization and splash control. In an embodiment, various components discussed with reference to FIGS. 1-3 may be utilized to perform one or more of the operations discussed with reference to FIG. 4. For example, the method 400 may be used to provide the atomized droplets 110.

Referring to FIGS. 1-4, at an operation 302, a flux nozzle with a plurality of injection holes may be provided (such as the flux nozzle 218). At an operation 404, flux fluid may be atomized, e.g., flux fluid 102 dispensed from the nozzle 218 into the flow 214 may be atomized. The atomized flux fluid may be deposited at an operation 406 (e.g., deposited onto the substrate 112). At an operation 408, the deposition of the flux fluid may be controlled (e.g., by using the shroud 222 to reduce or eliminate splash or overspray).

In various embodiments of the invention, the operations discussed herein, e.g., with reference to FIGS. 1-4, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIGS. 1-4.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:

a flux nozzle having a plurality of injection holes to deposit flux fluid through an exit hole of an air cap onto a substrate; and a shroud having a first end and a second end, wherein the first end of the shroud, having a smaller circumference than the second end of the shroud, is coupled to the air cap to control a deposition of the flux fluid, wherein the flux nozzle has a conical shape and one or more of the plurality of injection holes are located along a circumference of the flux nozzle and wherein the at least one of the flux nozzle or a flux tube, to transport the flux fluid to the flux nozzle, are inside the air cap, wherein the air cap has a cylindrical shape at least in portions of the air cap that are in proximity to the flux tube.

2. The apparatus of claim 1, wherein the substrate comprises a printed circuit board.

3. The apparatus of claim 1, further comprising a pump coupled to the air cap to provide a flow of an inert gas.

4. The apparatus of claim 3, wherein the inert gas comprises air, nitrogen, or mixtures thereof

5. An apparatus comprising:

a flux nozzle having a plurality of injection holes to deposit flux fluid through an exit hole of an air cap onto a substrate, wherein the flux nozzle has a conical shape and one or more of the plurality of injection holes are located along a circumference of the flux nozzle and wherein the air cap causes movement of gases in a swirling flow which is exhausted through the exit hole of the air cap; and a shroud having a first end and a second end, wherein the first end of the shroud, having a smaller circumference than the second end of the shroud, is coupled to the air cap to control a deposition of the flux fluid.

6. The apparatus of claim 5, further comprising a flux tube to transport the flux fluid to the flux nozzle, wherein the air cap has a cylindrical shape at least in portions of the air cap that are in proximity to the flux tube.

7. The apparatus of claim 5, wherein the at least one of the flux nozzle or a flux tube are inside the air cap.

8. The apparatus of claim 5, further comprising a pump coupled to the air cap to provide a flow of an inert gas.

9. An apparatus comprising:

a flux nozzle having a plurality of injection holes to deposit flux fluid through an exit hole of an air cap onto a substrate, wherein the flux nozzle has a conical shape and one or more of the plurality of injection holes are located along a circumference of the flux nozzle and wherein the air cap is to comprise an inlet to receive a gas flow and cause the gas flow to move in a swirling flow inside the air cap; and a shroud having a first end and a second end, wherein the first end of the shroud, having a smaller circumference than the second end of the shroud, is coupled to the air cap to control a deposition of the flux fluid.

10. The apparatus of claim 9, further comprising a flow regulator coupled between the air cap and a pump to regulate the gas flow.

11. The apparatus of claim 9, further comprising a flux tube to transport the flux fluid to the flux nozzle, wherein the air cap has a cylindrical shape at least in portions of the air cap that are in proximity to the flux tube.

12. The apparatus of claim 9, wherein the at least one of the flux nozzle or the flux tube are inside the air cap.

13. The apparatus of claim 9, further comprising a pump coupled to the air cap to provide a flow of an inert gas.

14. A method comprising:
provided a flux nozzle having a plurality of injection holes, wherein the flux nozzle has a conical shape and one or more of the plurality of injection holes are located along a circumference of the flux nozzle; and
pumping an inert gas into an air cap that houses the flux nozzle; and
reducing splash of a flux fluid by coupling a shroud, having a first end and a second end, wherein the first end of the shroud has a smaller circumference than the second end of the shroud, to the air cap that houses the flux nozzle at the first end of the shroud,
wherein the air cap causes movement of the inert gas in a swirling flow and wherein the plurality of injection holes are to deposit the flux fluid onto a substrate.

15. The method of claim 14, further comprising depositing the flux fluid through an exit hole of an air cap onto the substrate.

16. The method of claim 14, further comprising reducing splash of the flux fluid by sequential atomization and subsequent impingement of relatively smaller droplets on the substrate.

* * * * *